(12) United States Patent
Murayama et al.

(10) Patent No.: US 6,312,551 B1
(45) Date of Patent: Nov. 6, 2001

(54) METHOD FOR MOUNTING SEMICONDUCTOR CHIP ONTO CIRCUIT BOARD

(75) Inventors: Kei Murayama; Mitsutoshi Higashi, both of Nagano (JP)

(73) Assignee: Shinko Electric Industries Co., Ltd., Nagano (JP)

( * ) Notice: Subject to any disclaimer, the term of this patent is extended or adjusted under 35 U.S.C. 154(b) by 0 days.

(21) Appl. No.: 09/333,662

(22) Filed: Jun. 16, 1999

(30) Foreign Application Priority Data

Jun. 17, 1998 (JP) .................................................. 10-169412

(51) Int. Cl.[7] .................................................. H01L 21/00
(52) U.S. Cl. .............................................. 156/295; 29/832
(58) Field of Search ..................................... 156/295, 297, 156/298, 299, 311; 438/118, 119; 29/832, 840, 842

(56) References Cited

U.S. PATENT DOCUMENTS

| | | | |
|---|---|---|---|
| 5,074,036 | * 12/1991 | Dunaway et al. | 29/834 |
| 5,720,100 | 2/1998 | Skipor et al. | |
| 5,843,251 | * 12/1998 | Tsukagoshi et al. | 156/64 |
| 6,077,382 | * 6/2000 | Watanabe | 156/322 |

FOREIGN PATENT DOCUMENTS

| | | |
|---|---|---|
| 2-256252 | 10/1990 | (JP) . |
| 7-27924 | 3/1995 | (JP) . |
| 7-122591 | 5/1995 | (JP) . |
| 10-22344 | 1/1998 | (JP) . |
| 63-239826 | 10/1998 | (JP) . |
| 10-326852 | 12/1998 | (JP) . |

* cited by examiner

Primary Examiner—Jeff H. Aftergut
Assistant Examiner—John T. Haran
(74) Attorney, Agent, or Firm—Staas & Halsey LLP

(57) ABSTRACT

A process for mounting a semiconductor chip onto a circuit board adheres resin of ACF to a peripheral lateral surface of the semiconductor chip to a higher height level while avoiding the generation of voids within the resin of the ACF extending out of the periphery of the semiconductor chip. A semiconductor chip is mounted onto a circuit board via ACF and is pressed against the circuit board while heating the ACF and the peripheral region thereof extending out of the periphery of the semiconductor chip. A frame for adding a load is placed on the peripheral region of the ACF so that a gap is formed between the inside surface of the frame and the lateral surface of the semiconductor chip, and presses the peripheral region of the ACF against the circuit board, whereby the resin of the ACF is forced into the gap and adheres to the peripheral lateral surface of the semiconductor chip. Together therewith, gas dwelling in the inside of the peripheral region of the ACF is expelled therefrom to the outer air.

5 Claims, 4 Drawing Sheets

METHOD FOR MOUNTING SEMICONDUCTOR CHIP ONTO CIRCUIT BOARD

BACKGROUND OF THE INVENTION

1. Field of the Invention

The present invention relates to a process for surface-mounting a semiconductor chip onto a circuit board in a reliable manner.

2. Description of the Related Art

As a process, as described above, there has been known a mounting process illustrated in FIGS. 5 and 6. In FIG. 5, a resinous ACF 30 having a larger width than a semiconductor chip 20 is prepared, and then the semiconductor chip 20 is mounted onto a surface of a circuit board 10 via the ACF 30 whilst the ACF 30 extends beyond of the periphery of the semiconductor chip 20.

Next, as shown in FIG. 6, the ACF 30 and the peripheral region are heated while pressing the semiconductor chip 20 onto the circuit board 10. Thereby, thermosetting resin of the ACF 30 may be heated to approximately 180° C. for approximately several tens of seconds to be cured, or thermoplastic resin of the ACF 30 may be cooled and hardened after the heating. Thus, the semiconductor chip 20 is bonded via the resin of the ACF 30 onto a surface of the circuit board 10.

Electroconductive particles contained in the resin of the ACF 30 are interposed between conductive bumps 22 formed on electrodes of the semiconductor chip 20 and terminals 12 formed on the surface of the circuit board 10, so that the electric connection is obtained between the conductive bumps 22 of the semiconductor chip 20 and the terminals 12 of the circuit board 10 via the electroconductive particles.

In this regard, "ACF" is an abridgement of "anisotropic conductive film" made, for example, of thermosetting resin such as epoxy resin or of thermoplastic resin such as polyethylene. The ACF has electroconductive particles in the resin forming the same. When the semiconductor chip is surface-mounted on the circuit board as described above, it is possible to interpose the electroconductive particles contained in the ACF resin between the conductive bumps formed on the electrodes of the semiconductor chip and the terminals formed on the surface of the circuit board. Also, it is possible for an area of the ACF interposed between the conductive bump of the semiconductor chip and the terminal of the circuit board to be electrically conductive. Thus the electric connection is obtainable between the conductive bump of the semiconductor chip and the terminal of the circuit board via the electroconductive particles contained in that portion of the ACF resin.

According to this mounting process, the semiconductor chip 20 is bonded onto the surface of the circuit board 10 via the resin of the ACF 30. Together therewith, it is possible to electrically connect the conductive bump 22 formed on the electrode of the semiconductor chip 20 with the terminal 12 on the surface of the circuit board 10. Thus, the semiconductor chip 20 can be surface-mounted, without being stripped off, on the circuit board 10 in a reliable manner.

When the semiconductor chip 20 is surface-mounted onto the circuit board 10 in a manner as described above, however, it is impossible to assuredly adhere the resin of the ACF 30 extended out of the periphery of the semiconductor chip 20 to the upright lateral surface 24 thereof while raising the resin upward.

Therefore, when the semiconductor chip 20 has been surface-mounted onto the circuit board 10 by the above-mentioned process, the resin of the ACF 30 is liable to be stripped off in use from the peripheral portion of the semiconductor chip 20, whereby it is impossible to continue the favorable connection of the conductive bump 22 formed on the electrode of the semiconductor chip 20 with the terminal 12 formed on the surface of the circuit board 10. This causes the desirable electrical connection of the conductive bump 22 formed on the electrode of the semiconductor chip 20 with the terminal 12 formed on the surface of the circuit board 10 to be damaged.

Also, when semiconductor chip 20 is surface-mounted onto the circuit board 10 via the ACF resin by the above-mentioned process, gas generated from the resin of the ACF 30 during the heating or air dwelling in the inside of the ACF 30 and expanding during the heating is expelled to the outer air encircling the semiconductor chip 20 through the ACF 30 interposed between the semiconductor chip 20 and the circuit board 10, which is softened during the heating.

However, when the semiconductor chip 20 is surface-mounted to the circuit board 10 by the above-mentioned process, all the gas or air in the interior of the ACF 30 is not suitably expelled to the outer air encircling the semiconductor chip 20 through the softened ACF 30, but tends to dwell in the inside of a portion of the ACF 30 in the peripheral region of the semiconductor chip 20 which is free from the pressure from the semiconductor chip 20, forming voids 32 therein, as shown in FIG. 6.

Therefore, the reliable bonding is not obtainable between the semiconductor chip 20 and the surface of the circuit board 10 via the resin of the portion of the ACF 30 wherein the void 32 is formed.

As a result, if the semiconductor chip 20 is surface-mounted onto the circuit board 10 by the above-mentioned process, the semiconductor chip 20 bonded to the circuit board 10 via the resin of the ACF 30 has been liable to be stripped off from the surface of the circuit board 10 during use, whereby the electrical connection between the conductive bump 22 formed on the electrode of the semiconductor chip 20 and the terminal 12 formed on the surface of the circuit board 10 is damaged.

The same is true of a semiconductor chip 20 surface-mounted onto a circuit board 10 by bonding the semiconductor chip 20 with the surface of the circuit board 10 via an electro-insulating film of thermosetting or thermoplastic resin, in the same manner as described above, wherein conductive bumps 22 formed on the semiconductor chip 20 are electrically connected to terminals 12 formed on the surface of the circuit board 10.

SUMMARY OF THE INVENTION

An object of the present invention is to provide a process for surface-mounting a semiconductor chip onto a circuit board, hereinafter referred merely to as a "mounting process", in which the above-mentioned problems in the prior art can be solved.

Another object of the present invention is to provide a process for surface-mounting a semiconductor chip onto a circuit, capable of reliably and firmly surface-mounting the semiconductor chip onto the circuit board via a film-like resin, such as ACF, wherein part of the film-like resin such as the ACF extending out of the periphery of the semiconductor chip is raised upward along the peripheral lateral surface of semiconductor chip.

According to the present invention, there is provided a process for surface-mounting a semiconductor chip having electrodes onto a circuit board providing with terminals, the process comprising:

mounting a semiconductor chip onto a circuit board by interposing a resin film therebetween, in such a manner that a periphery of the resin film extends out of a periphery of the semiconductor chip, and placing a frame-shaped load member for enclosing the periphery of the semiconductor chip with a gap therebetween; and adhering the semiconductor chip to a surface of the circuit board by means of the resin film by pressing the semiconductor chip and the load member toward the circuit board and heating at least the periphery of the resin film, so that the electrodes of the semiconductor chip come into electrical contact with the terminals on the circuit board, and resin of the resin film is softened so as to be urged into the gap and attached to a side wall of the semiconductor chip.

The semiconductor chip may have a rectangular shape and the frame-shaped load member also has a rectangular shape, so that the gap defines a constant width between a side wall of the semiconductor chip and an inner wall of the frame-shaped load member.

In this mounting process, the film portion extending out of the periphery of the semiconductor chip can be pressed against the circuit board due to the action of the load adding frame carried on a surface of the film portion extending out of the periphery of the semiconductor chip during the heating of the film and the peripheral region thereof while pressing the semiconductor chip against the circuit board. Thereby, it is possible to assuredly force the heated and softened resin of the extended film portion into a gap between the inner surface of the frame and the lateral surface of the semiconductor chip while using the pressure applied by the load-adding frame and/or a capillary action. Thus, the softened resin is adhered to the upright peripheral lateral surface of the semiconductor chip to a greater height thereof.

Also, it is possible to assuredly expel gas generated from the film resin when the film and the peripheral region thereof are heated and/or air dwelling in the inside of the film which also expands when the film and/or the peripheral region thereof are heated, from the inside of the softened film portion around the semiconductor chip to the outer air, by the pressure applied from the frame. Thus the formation of voids is avoidable in the inside of the resin of the film around the semiconductor chip.

In a process as mentioned above, the frame-shaped load member can be removed from the circuit board after the resin is attached to the side wall of the semiconductor chip. Otherwise, the frame-shaped load member can remain, without removal from the circuit board, after the resin is attached to the side wall of the semiconductor chip.

According to a mounting process wherein the frame is removed from the resin of the film, the frame is usable again when another semiconductor chip is mounted onto the circuit board. Also, a size of the circuit board on which the semiconductor chip is mounted can be minimized by the removal of the frame.

According to a mounting process wherein the frame is preliminarily bonded to the surface of the circuit board via the resin of the film, it is possible to protect the semiconductor chip disposed in the inside of the frame by the frame. Also, it is possible to prevent, due to the stiffness of the frame, the circuit board on which the semiconductor chip is mounted from being warped.

The resin film may be an anisotropic conductive film (ACF), so that said electrodes of the semiconductor chip are in electrical contact with said terminals on said circuit board by means of electroconductive particles contained in a resin of said AFC.

According to this mounting process, when the ACF and the peripheral region thereof are heated while pressing the semiconductor chip against the circuit board, the softened resin in a portion of the ACF extending beyond the periphery of the semiconductor chip is assuredly forced into a gap between the inside surface of the frame and the lateral surface of the semiconductor chip by using the pressure of the frame for pressing the portion of the ACF against the circuit board and/or the capillary action, whereby the softened resin is adhered to the upright peripheral lateral surface of the semiconductor chip at a greater height.

Also, when the ACF and the peripheral region thereof are heated, it is possible to assuredly expel gas generated from the ACF resin and/or air dwelling in the interior of the ACF and expanded by the heating from the inside of the ACF portion to the outer air, not leaving the same inside of the peripheral region of the softened ACF surrounding the semiconductor chip, whereby no voids are formed in the inside of the peripheral region of the softened ACF surrounding the semiconductor chip.

DETAILED DESCRIPTION OF THE EMBODIMENTS

The present invention will be described in more detail with reference to the preferred embodiment illustrated in the attached drawings.

Figure 1:
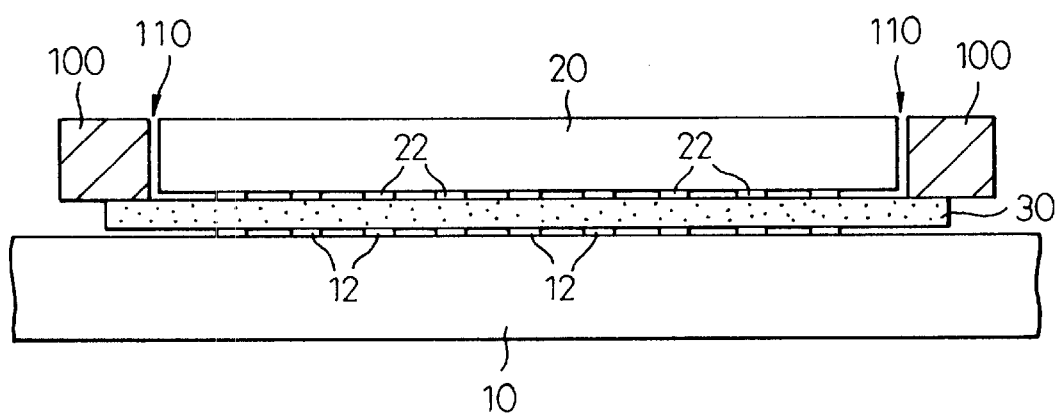
FIG. 1 is an illustration of a mounting process according to the present invention.
Figure 2:
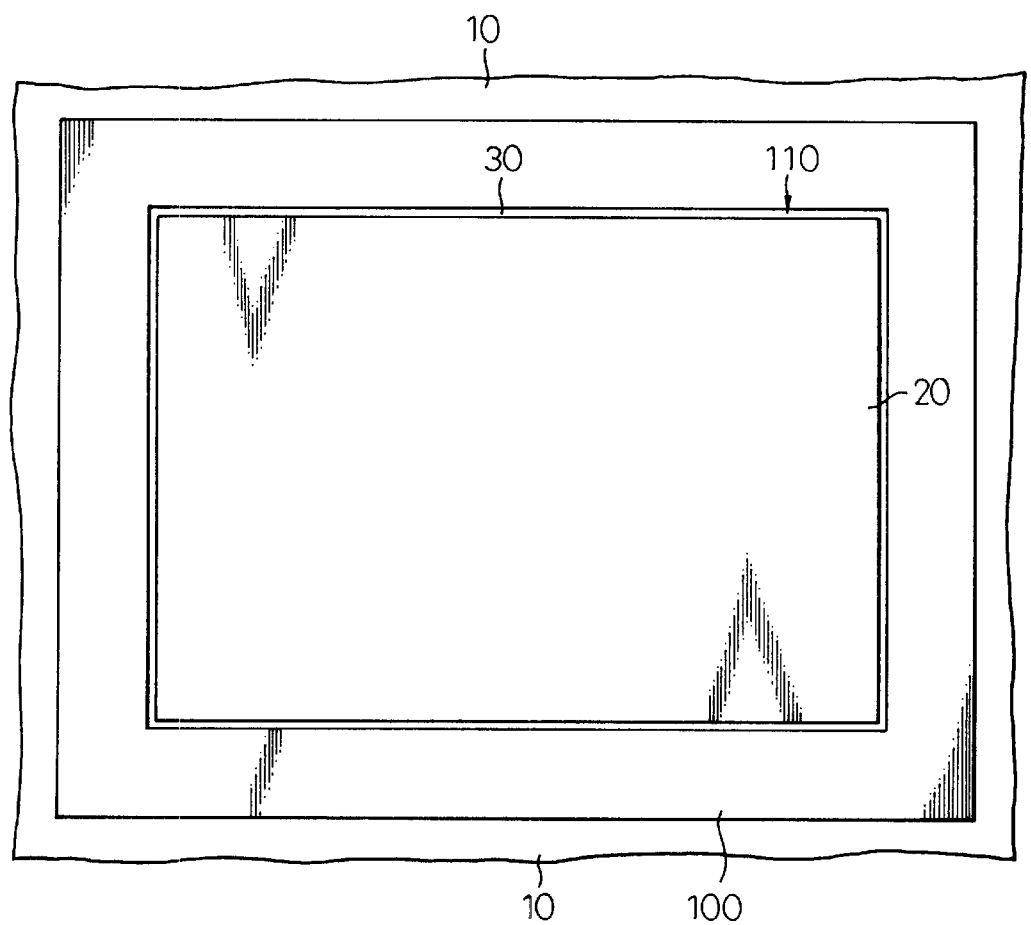
FIG. 2 is an illustration of a mounting process according to the present invention.
Figure 3:
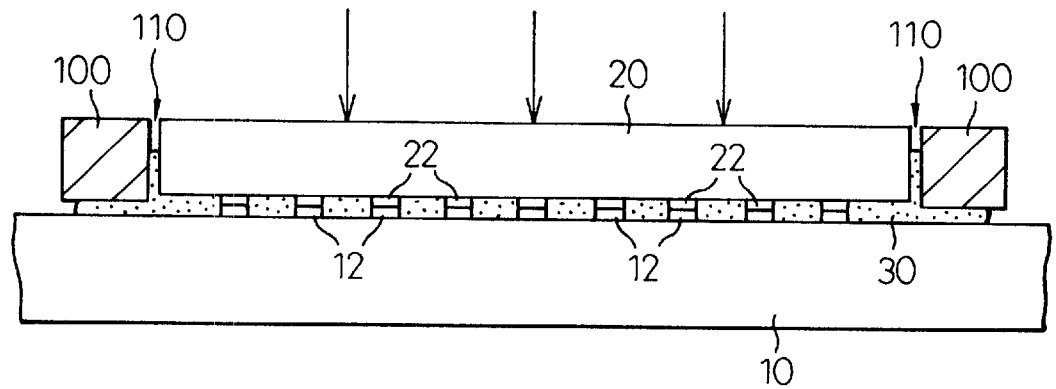
FIG. 3 is an illustration of a mounting process according to the present invention.

FIGS. 1 to 3 illustrate a sequence of steps for carrying out one preferred aspect of a mounting process according to the present invention.

According to the mounting process illustrated, as shown in FIGS. 1 and 2, an ACF 30 is prepared from a resin sheet having a somewhat larger size than a semiconductor chip 20. The semiconductor chip 20 is mounted onto a surface of a circuit board 10 via the ACF 30 whilst the peripheral region of the ACF 30 extends out of the periphery of the semiconductor chip 20.

Then, as shown in FIG. 3, the semiconductor chip 20 is pressed against the circuit board 10 at a pressure from approximately 10 to 20 Kg/cm$^2$ whilst heating the ACF 30 and the peripheral region thereof. If the ACF 30 is made of thermosetting resin, it is cured by the heating to about 180° C. for about 20 seconds to 60 seconds, while if it is made of thermoplastic resin, it is heated and then cooled to be hardened. The semiconductor chip 20 is thus bonded to the surface of the circuit board 10 via the ACF 30.

Together therewith, electroconductive particles (not shown) contained in the resin of the ACF 30 are interposed between conductive bumps 22 formed on electrodes of the semiconductor chip 20 and terminals 12 formed on the surface of the circuit board 10. Thereby, electrical connection is obtained between the conductive bump 22 of the semiconductor chip 20 and the terminal 12 of the circuit board 10 via the electroconductive particles.

The above process is the same as the conventional mounting process described before. A difference, however, exists in that when the ACF 30 and the peripheral region thereof are heated while pressing the semiconductor chip 20 against the circuit board 10, a frame 100 is placed on the peripheral region of the ACF 30, extending beyond the periphery of the semiconductor chip 20, for adding a load to this region, so that the frame 100 encircles the semiconductor chip 20 while leaving a gap 110 between the inside surface of the frame 100 and the lateral surface of the semiconductor chip 20. The frame 100 presses a surface of the peripheral region of the ACF 30, extending out of the periphery of the semiconductor chip 20, against the circuit board 10. The frame 100 is made of heat-resistant metal such as stainless steel. The frame 100 may be placed on the surface of the peripheral region of the ACF 30 either directly after the semiconductor chip 20 is mounted onto the surface of the circuit board 10 via the ACF 30 as shown in FIGS. 1 and 2 or before the semiconductor chip 20 is mounted onto the surface of the circuit board 10, provided the ACF 30 has not yet been heated whilst the semiconductor chip 20 is pressed against the circuit board 10.

Examples of the ACF are as follows:
(1) FC 262 B produced by Hitachi Chemical Co., Ltd. (epoxy type resin containing Ni particles)
(2) MJ 932 and MJ 353 produced by Sony Chemicals Corporation (epoxy type resin containing acrylic resin particles plated with Ni or Au)

Figure 4:
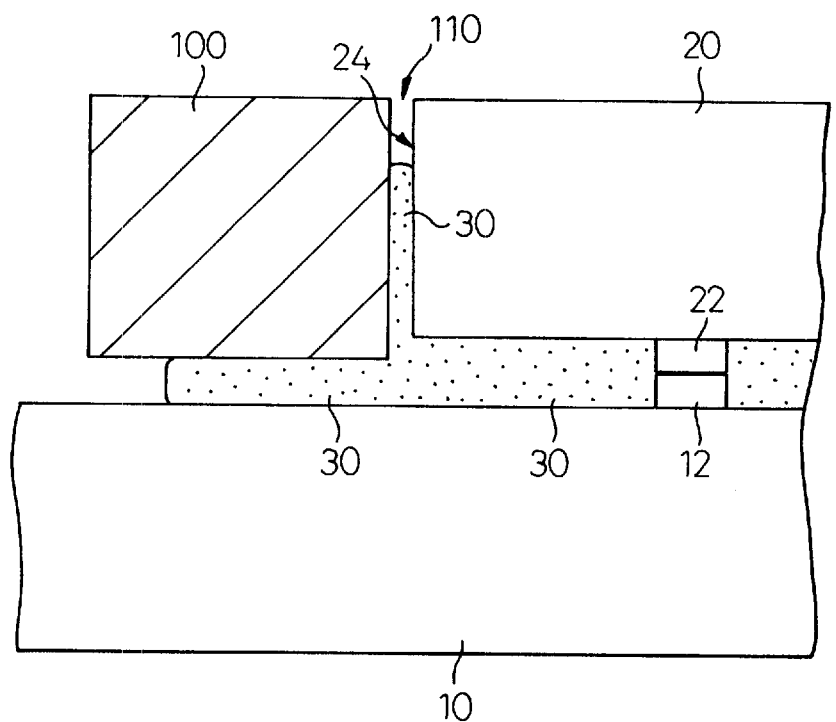
FIG. 4 is an enlarged partial view of a peripheral region of a semiconductor chip surface-mounted onto a circuit board by the mounting process according to the present invention.
Figure 5:
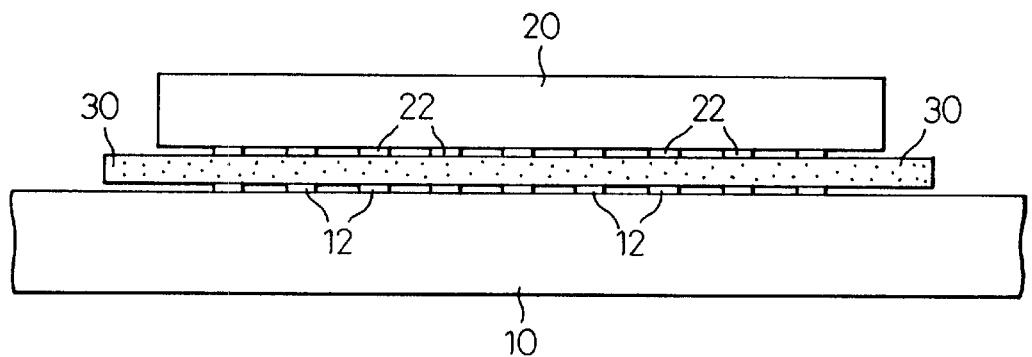
FIG. 5 is an illustration of a prior art mounting process.

The mounting process shown in FIGS. 1 to 3 comprises the above-mentioned steps, whereby it is possible to force the softened resin of the ACF 30, extended out of the periphery of the semiconductor chip 20, into a gap 110 between the inside surface of the frame 100 and the upright lateral surface 24 of the semiconductor chip when the ACF 30 and the peripheral region thereof are heated while pressing the semiconductor chip 20 against the circuit board 10, due to the pressure of the frame 100 applied to the circuit board 10 and/or a capillary action. The softened resin in the peripheral region of the ACF 30 can adhere to the upright peripheral side surface 24 of the semiconductor chip 20 to a greater height, as shown in FIG. 4.

Figure 6:
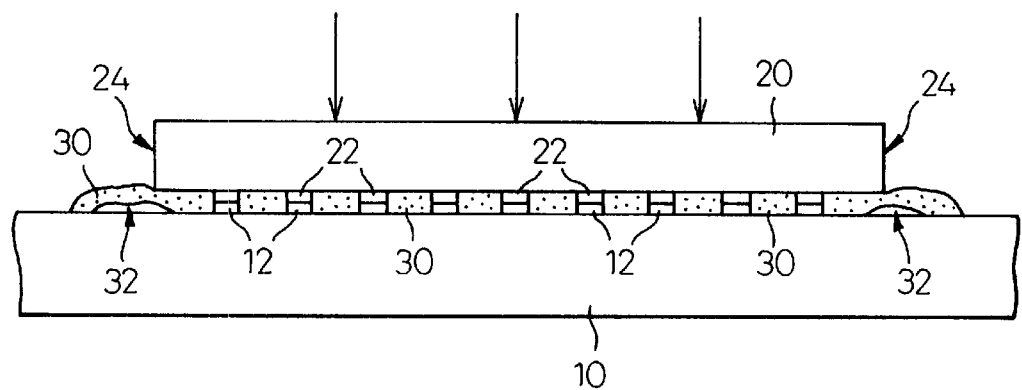
FIG. 6 is an illustration of a prior art mounting process.

When the ACF 30 and the peripheral region thereof are heated, gas generated from the resin of the ACF 30 during the heating and/or air dwelling in the inside of the ACF 30 and expanding during the heating are assuredly expelled, without being left, from the interior of the softened region of the ACF 30 extending out of the periphery of the semiconductor chip 20 to the outer air. Thereby, no voids 32 as in FIG. 6 are formed in the interior of the peripheral region of the ACF 30 extended out of the periphery of the semiconductor chip 20.

An insulating resinous film (not shown) of thermosetting resin such as epoxy resin or thermoplastic resin such as polyethylene may be used in the above-mentioned mounting process, instead of the ACF 30 as a resinous film.

In the same manner as described before, the semiconductor chip 20 is preferably mounted onto the surface of the circuit board 10 via the insulating resinous film disposed therebetween while extending the peripheral region thereof out of the periphery of the semiconductor chip 20. The frame 100 is preferably placed on the portion of the resinous film extending out of the periphery of the semiconductor chip 20 while leaving a gap 110 between the inside surface of the frame and the lateral surface of the semiconductor chip 20. Preferably, the resinous film and the peripheral portion thereof are heated whilst pressing the semiconductor chip 20 against the circuit board 10. Preferably, the thermosetting resin of the resinous film is heated to be cured, or the thermoplastic resin of the resinous film is heated and then cooled to be hardened. Thus, the semiconductor chip 20 is bonded to the surface of the circuit board 10 via the resinous film. The semiconductor chip 20 is preferably bonded to the surface of the circuit board 10 via the resin of the resinous film. Together therewith, preferably, the conductive bump 22 formed on the electrode of the semiconductor chip 20 is electrically connected to the terminal 12 formed on the surface of the circuit board 10. The semiconductor chip 20 is surface-mounted onto the circuit board 10 via the insulating resinous film.

An example of the resinous film used as an adhesive is 1592 produced by Sumitomo 3M Ltd (organic resin mainly composed of polyolefin.

In a mounting process wherein this resinous film is used, heated and softened resin of a portion extending beyond the periphery of the semiconductor chip 20 is assuredly forced into a gap between the inside surface of the frame 100 and the lateral surface of the semiconductor chip 20 due to a pressure from the frame 100 and/or capillary action. Thus, it is possible to adhere the softened resin of the portion of the resinous film to the peripheral lateral surface of semiconductor chip 20 to a greater height. Together therewith, gas generated from the resin of the resinous film during the heating or air dwelling in the inside of the resinous film and expanding during the heating is assuredly expelled from the interior of the softened resinous film to the outer air, without being left in the interior thereof. The semiconductor chip 20 is firmly bonded to the surface of the circuit board 10, and so as not to be easily stripped therefrom.

In the mounting process described with reference to FIGS. 1 to 3, the frame 100, placed on the peripheral region of the ACF 30 or other film extending out of the periphery of the semiconductor chip 20, may be either removed from the resinous surface of the ACF 30 or other film after the resin thereof has been adhered to the peripheral lateral surface of the semiconductor chip 20 to a greater height or left as it is while being bonded to the surface of the circuit board 10 via the resin of the ACF 30 or other film. There is no adverse effect on functions of the semiconductor chip 20, as surface-mounted to the circuit board 10, even if the frame 100 is either left on the circuit board 10 while being bonded via the resin of the film, or is removed therefrom.

The frame 100 removed from the film surface may be used again when another semiconductor chip 20 is surface-mounted onto the circuit board 10. If the frame is removed, a size of the circuit board 10 on which the semiconductor chip 20 is surface-mounted could be minimized by the volume of the removed frame 100.

If the frame 100 is left on the circuit board 10 while being bonded thereto via the film resin, it is possible to protect the semiconductor chip 20 disposed inside the frame 100 thereby. Also, due to the stiffness of the frame 100, it is possible to prevent the circuit board 10 on which the semiconductor chip 20 is mounted from being warped.

If the frame 100 is removed from the surface of the film resin after the film resin has been adhered to the peripheral lateral surface of the semiconductor chip 20, the peripheral surface of the frame 100 may preferably be coated with a heat-resistant resin such as Teflon or others so that the ease of stripping-off of the frame 100 from the resinous surface of the film is enhanced.

The frame 100 may have any shape, such as a shape of a picture frame or a box having a ceiling wall, provided it can provide pressure onto the peripheral region of the ACF 30 or other film extending out of the periphery of the semiconductor chip 20.

As described hereinabove, in the mounting process according to the present invention, the semiconductor chip is pressed against the circuit board while heating the resinous film such as ACF and the peripheral region thereof extending out of the periphery of the semiconductor chip, so that the heated and softened resin of the film in that region is adhered to the peripheral lateral upright surface of the semiconductor chip to a greater height. Together therewith, it is possible to prevent voids from being formed in the inside of the peripheral region of the film such as ACF. The semiconductor chip is reliably and firmly bonded to the surface of the circuit board via the film resin such as ACF, not to be easily stripped off therefrom. Thus it is possible to maintain the electrical connection between the conductive bumps formed on the electrodes of the semiconductor chip and the terminals formed on the surface of the circuit board for a longer period.

It should be understood by those skilled in the art that the foregoing description relates to only some of preferred embodiments of the disclosed invention, and that various changes and modifications may be made to the invention without departing from the spirit and scope thereof.

What is claimed is:

1. A process for surface-mounting a semiconductor chip having electrodes onto a circuit board provided with terminals, said process comprising:

mounting a semiconductor chip onto a circuit board by interposing a resin film therebetween, such that a periphery of said resin film extends beyond a periphery of said semiconductor chip, and placing a frame-shaped load member on said periphery of said resin film for enclosing said periphery of said semiconductor chip with a gap therebetween; and adhering said semiconductor chip to a surface of said circuit board by means of said resin film by pressing said semiconductor chip and said load member toward said circuit board and heating at least said periphery of the resin film, so that said electrodes of the semiconductor chip come into electrical contact with respective said terminals on said circuit board and resin of said resin film is softened so as to be urged into said gap due to a pressure of said load member and adhered to a side wall of said semiconductor chip.

2. A process as set forth in claim 1 further comprising a step of:

removing said frame-shaped load member from said circuit board after said resin is adhered to the side wall of said semiconductor chip.

3. A process as set forth in claim 1 further comprising a step of:

leaving said frame-shaped load member without removing it from said circuit board after said resin is adhered to the side wall of said semiconductor chip.

4. A process as set forth in claim 1, wherein said semiconductor chip has a rectangular shape and said frame-shaped load member also has a rectangular shape, so that said gap defines a constant width between a side wall of said semiconductor chip and an inner wall of said frame-shaped load member.

5. A process as set forth in claim 1, wherein said resin film is an anisotropic conductive film (ACF) having electroconductive particles therein electrically connecting electrodes of the semiconductor chip with respective said terminals on said circuit board.

* * * * *

UNITED STATES PATENT AND TRADEMARK OFFICE
CERTIFICATE OF CORRECTION

PATENT NO.    : 6,312,551 B1
DATED         : November 6, 2001
INVENTOR(S)   : Kei Murayama et al.

It is certified that error appears in the above-identified patent and that said Letters Patent is hereby corrected as shown below:

Column 4,
Line 67, after "Thereby" insert -- an --;

Column 5,
Line 57, after "polyethyline" insert -- , --.

Column 6,
Line 44, change "50" to -- so --.
Line 46, after "film" delete ",".

Column 8,
Line 10, after "softened" insert -- , --.

Signed and Sealed this

Ninth Day of April, 2002

*Attest:*

JAMES E. ROGAN
*Director of the United States Patent and Trademark Office*

*Attesting Officer*